United States Patent
Wu et al.

(10) Patent No.: US 7,682,897 B2
(45) Date of Patent: Mar. 23, 2010

(54) DRAM FABRICATION METHOD USING OXIDATION SPACERS ON PILLAR DIELECTRIC SIDEWALLS

(75) Inventors: Chih-Huang Wu, Taoyuan County (TW); Chien-Jung Yang, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 255 days.

(21) Appl. No.: 11/758,014

(22) Filed: Jun. 5, 2007

(65) Prior Publication Data

US 2008/0248619 A1    Oct. 9, 2008

(30) Foreign Application Priority Data

Apr. 3, 2007    (TW) ............................... 96111755 A

(51) Int. Cl.
*H01L 21/8242*    (2006.01)
(52) U.S. Cl. .................. 438/247; 257/E21.651
(58) Field of Classification Search .......... 438/247; 257/E21.651
See application file for complete search history.

(56) References Cited

U.S. PATENT DOCUMENTS

| 5,373,178 | A | * | 12/1994 | Motoyoshi et al. | .......... 257/344 |
| 6,610,575 | B1 | * | 8/2003 | Ang et al. | .................. 438/275 |
| 6,815,300 | B2 | | 11/2004 | Jeong et al. | |
| 7,169,676 | B1 | * | 1/2007 | Zhong | .......... 438/302 |
| 2001/0001722 | A1 | * | 5/2001 | Forbes et al. | ............... 438/268 |
| 2003/0169629 | A1 | * | 9/2003 | Goebel et al. | ............... 365/200 |

* cited by examiner

*Primary Examiner*—Matthew Smith
*Assistant Examiner*—Walter H Swanson
(74) *Attorney, Agent, or Firm*—Jianq Chyun IP Office

(57) ABSTRACT

A process for fabricating a dynamic random access memory is provided. In this fabrication process, the steps of forming the silicon layer, and performing the ion implantation process and the removing process are repeated at least twice and the oxidation process is performed once to form an oxidation spacer that is larger than the landing area for a bit line contact in the prior art. Therefore, when defining a bit line contact opening, a larger process window is fabricated to prevent the occurrence of a short between the bit line contact and the gate of a transistor due to misalignment.

13 Claims, 14 Drawing Sheets

(a)

(b)

(a)

(b)

(a)

(b)

(a)

(b)

(a)

(b)

(a)

(b)

(a)

(b)

(a)

(b)

(a)

(b)

DRAM FABRICATION METHOD USING OXIDATION SPACERS ON PILLAR DIELECTRIC SIDEWALLS

CROSS-REFERENCE TO RELATED APPLICATION

This application claims the priority benefit of Taiwan application serial no. 96111755, filed Apr. 3, 2007. All disclosure of the Taiwan application is incorporated herein by reference.

BACKGROUND OF THE INVENTION

1. Field of the Invention

The present invention relates to a process for fabricating a memory device. More particularly, the present invention relates to a process for fabricating a dynamic random access memory (DRAM).

2. Description of Related Art

Generally, the memory unit of a dynamic random access memory (DRAM) includes a transistor and a capacitor. As the device dimension is gradually miniaturized, the space available for accommodating a capacitor in a DRAM device is also shrunk. Therefore, a trench capacitor formed in a substrate that can effectively utilize the space available in the substrate satisfies the current market demand. At present, DRAM devices are frequently fabricated with deep-trench (DT) capacitors having large capacitance for better performance.

FIG. 1 through FIG. 4 are schematic views illustrating the steps for fabricating a conventional dynamic random access memory (DRAM). Sub-diagrams (a) of FIG. 1 through FIG. 4 illustrate schematic top views and sub-diagrams (b) of FIG. 1 through FIG. 4 illustrate schematic cross-sectional views along line I-I' of FIG. 1(a) through FIG. 4(a).

First, please refer to FIG. 1. A plurality of trenches 102 are formed in a substrate 100. Further, a trench capacitor 104 is formed in each trench 102, and a pillar oxidation layer 106 is formed on the trench capacitor 104. In addition, a silicon nitride layer 108 is formed on the substrate 100 to conformably cover the pillar oxidation layer 106.

Next, please refer to FIG. 2. A silicon layer 110 is formed over the substrate 100 to conformably cover the silicon nitride layer 108. The material used for fabricating the silicon layer 110 is, for example, polysilicon or amorphous silicon. Thereafter, a tilt angle ion implantation process 112 is performed to form a doped region 113 in a portion of the silicon layer 110 disposed on two sides of the pillar oxidation layer 106. As a result, the etch rate of the doped region 113 is slower than that of the silicon layer 110 that is not covered by the doped region 113.

Afterward, please refer to FIG. 3. An etching process is performed to remove the silicon layer 110 but retain the doped region 113. Subsequently, please refer to FIG. 4. An oxidation process is performed to the doped region 113 to form oxidation spacers 114 containing both silicon layer and oxidation layer. Then, an active area (AA) 116 is defined between two adjacent trenches 102. Next, a transistor (not shown) is formed in the active area 116 and the source/drain region (not shown) of this transistor is formed below the oxidation spacers 114 in the substrate 100.

After the transistor is fabricated, the oxidation spacers 114 are removed to form a bit line contact (not shown) to electrically connect the source/drain region of the transistor to the bit line to be formed. More specifically, the region of the above-mentioned oxidation spacers is the landing area for the bit line contact. Nevertheless, according to the above-mentioned prior art, if the pattern of the bit line contact opening cannot be defined within the range of length for the oxidation spacers 114, overlay errors that lead to misalignment issues are resulted. The aforementioned misalignment problem shifts the bit line contact to be formed to the edge of the transistor gate, causing a short between the bit line contact and the transistor gate and thus affecting the device performance.

Therefore, it has become one of the major goals in the development of the semiconductor industry to produce a high quality device that prevents the aforementioned problem.

SUMMARY OF THE INVENTION

The present invention is directed to a process for fabricating a dynamic random access memory that prevents the occurrence of short between the bit line contact and the transistor gate in order to enhance the device performance.

The present invention is directed to a process for fabricating a dynamic random access memory. According to this fabrication process, a plurality of trenches are formed in a substrate and a trench capacitor is formed in each trench. Further, a pillar dielectric layer is formed on the trench capacitor and the surface of the pillar dielectric layer protrudes from the surface of the substrate. Next, a silicon nitride layer and a first silicon layer are sequentially formed on the substrate to conformably cover the pillar dielectric layer. The thickness of the first silicon layer is smaller than that of a design rule for optimization of fabrication. Thereafter, a first ion implantation process is performed to implant ions into the first silicon layer disposed on top of the pillar dielectric layer and the first silicon layer disposed on the two sidewalls of the pillar dielectric layer. Herein, ions are diffused into the first silicon layer disposed on the two sidewalls of the pillar dielectric layer to form a first doped region. Afterward, a first removing process is performed to remove the first silicon layer disposed on top of the pillar dielectric layer and on the first non-doped region, but retain the first doped region. Subsequently, a second silicon layer is formed on the substrate to conformably cover the silicon nitride layer and the first doped region. Thereafter, a second ion implantation process is performed to implant ions into a second silicon layer disposed on top of the pillar dielectric layer and the second silicon layer disposed on the two sidewalls of the pillar dielectric layer. Herein, ions are diffused into the second silicon layer disposed on the two sidewalls of the pillar dielectric layer to form a second doped region. Subsequently, a second removing process is performed to remove the second silicon layer disposed on top of the pillar dielectric layer and on the second non-doped region, but retain the second doped region. Then, an oxidation process is performed to the first doped region and the second doped region to form an oxidation spacer on the sidewalls of the pillar dielectric layer.

According to one embodiment of the present invention, the thickness of the first silicon layer is smaller than that of a design rule for optimization of fabrication.

According to one embodiment of the present invention, the etch rate of the first doped region is slower than that of the first silicon layer that is not covered by the first doped region.

According to one embodiment of the present invention, the thickness of the second silicon layer is smaller than that of a design rule for optimization of fabrication.

According to one embodiment of the present invention, the etch rate of the second doped region is slower than that of the second silicon layer that is not covered by the second doped region.

According to one embodiment of the present invention, the thickness of the oxidation spacer is smaller than that of a design rule for optimization of fabrication.

According to one embodiment of the present invention, an active area is further defined between two adjacent trenches after the formation of the oxidation spacer. Then, a transistor is formed in the active area that is outside the oxidation spacer.

According to one embodiment of the present invention, the first ion implantation process is a tilt angle ion implantation process. Further, the second ion implantation process is a tilt angle ion implantation process.

According to one embodiment of the present invention, the material used for fabricating the pillar dielectric layer is, for example, silicon oxide.

According to one embodiment of the present invention, the material used for fabricating the first silicon layer and the second silicon layer is, for example, polysilicon or amorphous silicon.

According to one embodiment of the present invention, the first removing process includes, for example, performing an anisotropic etching process to etch a portion of the first silicon layer disposed on the substrate and on top of the pillar dielectric layer, but not the portion of the first silicon layer disposed on the sidewalls of the pillar dielectric layer and the first doped region. Next, an isotropic etching process is performed to etch the non-doped region of the first silicon layer, but not the first doped region. The etchant used for the above-mentioned isotropic etching process is, for example, ammonia water or potassium hydroxide.

According to one embodiment of the present invention, the second removing process includes, for example, performing an anisotropic etching process to etch a portion of the second silicon layer disposed on the substrate and on top of the pillar dielectric layer, but not the portion of the second silicon layer disposed on the sidewalls of the pillar dielectric layer and the second doped region. Next, an isotropic etching process is performed to etch the non-doped region of the second silicon layer, but not the second doped region. The etchant used for the above-mentioned isotropic etching process is, for example, ammonia water or potassium hydroxide.

According to one embodiment of the present invention, after the second removing process is performed and prior to performing the oxidation process, the steps (a) through (c) can be performed at least once and these steps are described as follows: (a) A third silicon layer is formed on the substrate to conformably cover the silicon nitride layer and the second doped region, wherein the thickness of the third silicon layer is smaller than that of a design rule for optimization of fabrication; (b) A third ion implantation process is performed to implant ions into the third silicon layer disposed on top of the pillar dielectric layer and the third silicon layer disposed on the two sidewalls of the pillar dielectric layer, wherein ions are diffused into the third silicon layer disposed on the two sidewalls of the pillar dielectric layer to form a third doped region, and the etch rate of the third doped region is slower than that of the third silicon layer that is not covered by the third doped region; (c) A third removing process is performed to remove the third silicon layer disposed on top of the pillar dielectric layer and the third silicon layer of the third non-doped region, but not the third doped region. The above-mentioned third ion implantation process is a tilt angle ion implantation process. Further, the third removing process, for example, includes performing an anisotropic etching process to etch a portion of the third silicon layer disposed on the substrate and on top of the pillar dielectric layer, but not the portion of the third silicon layer disposed on the sidewalls of the pillar dielectric layer and the third doped region. Afterward, an isotropic etching process is performed to etch the non-doped region of the third silicon layer, but not the third doped region. Herein, the etchant used for the above-mentioned isotropic etching process is, for example, ammonia water or potassium hydroxide.

According to the fabrication process of the present invention, the thickness of the first silicon layer is smaller than that of a design rule for optimization of fabrication. Further, when the first ion implantation process is performed, the length of the doped region formed in the first silicon layer is longer than that of a design rule for optimization of fabrication. As a result, the region of the oxidation spacer subsequently formed is larger than the region for the landing area of the conventional bit line contact. Therefore, according to the fabrication process of the present invention, a larger process window is formed when defining the bit line contact opening, which prevents overlay errors and misalignment problems that lead to a short between the bit line contact and the transistor.

In order to the make the aforementioned and other objects, features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIG. 5 through FIG. 14 are schematic views illustrating the steps for fabricating a dynamic random access memory (DRAM) according to the embodiment of the present invention. The sub-diagrams (a) of FIG. 5 through FIG. 14 illustrate schematic top views and sub-diagrams (b) of FIG. 5 through FIG. 14 illustrate schematic cross-sectional views along line II-II' of FIG. 5($a$) through FIG. 14($a$).

Figure 1:
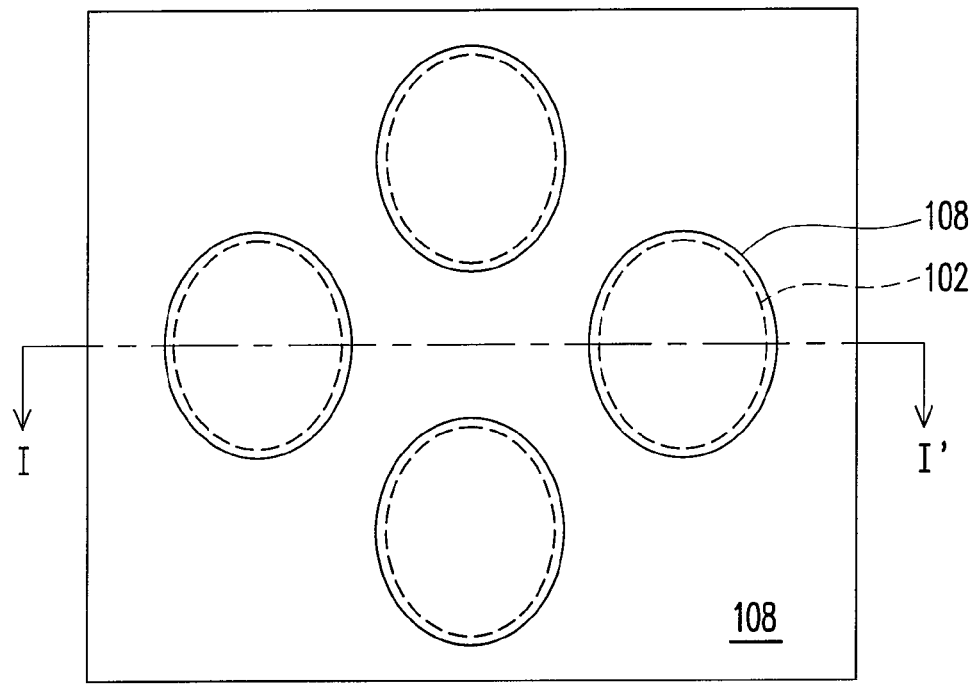
FIG. 1 through FIG. 4 are schematic views illustrating the steps for fabricating a conventional dynamic random access memory (DRAM). Herein, the sub-diagrams (a) of FIG. 1 through FIG. 4 illustrate schematic top views and sub-diagrams (b) of FIG. 1 through FIG. 4 illustrate schematic cross-sectional views along line I-I' of FIG. 1($a$) through FIG. 4($a$).
Figure 1:
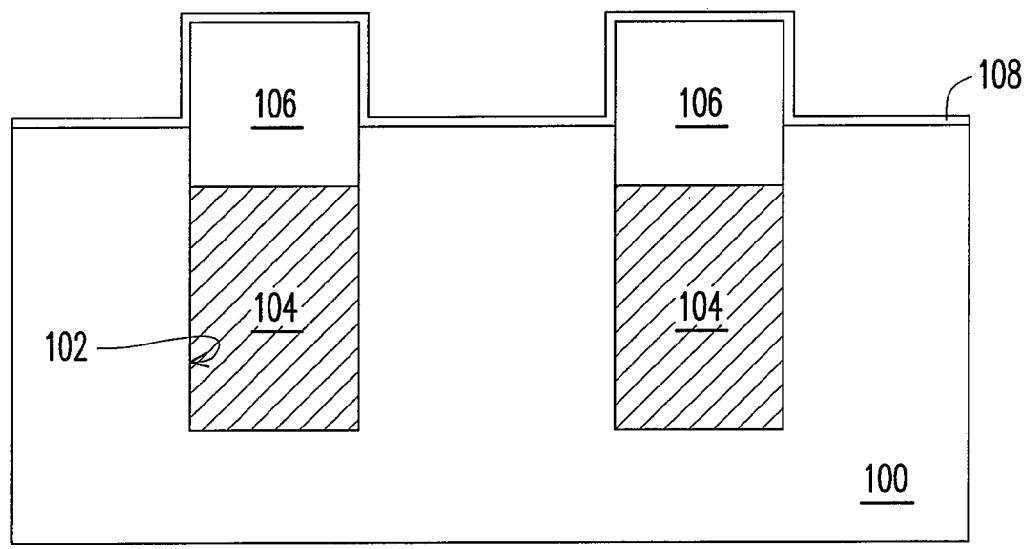
Figure 2:
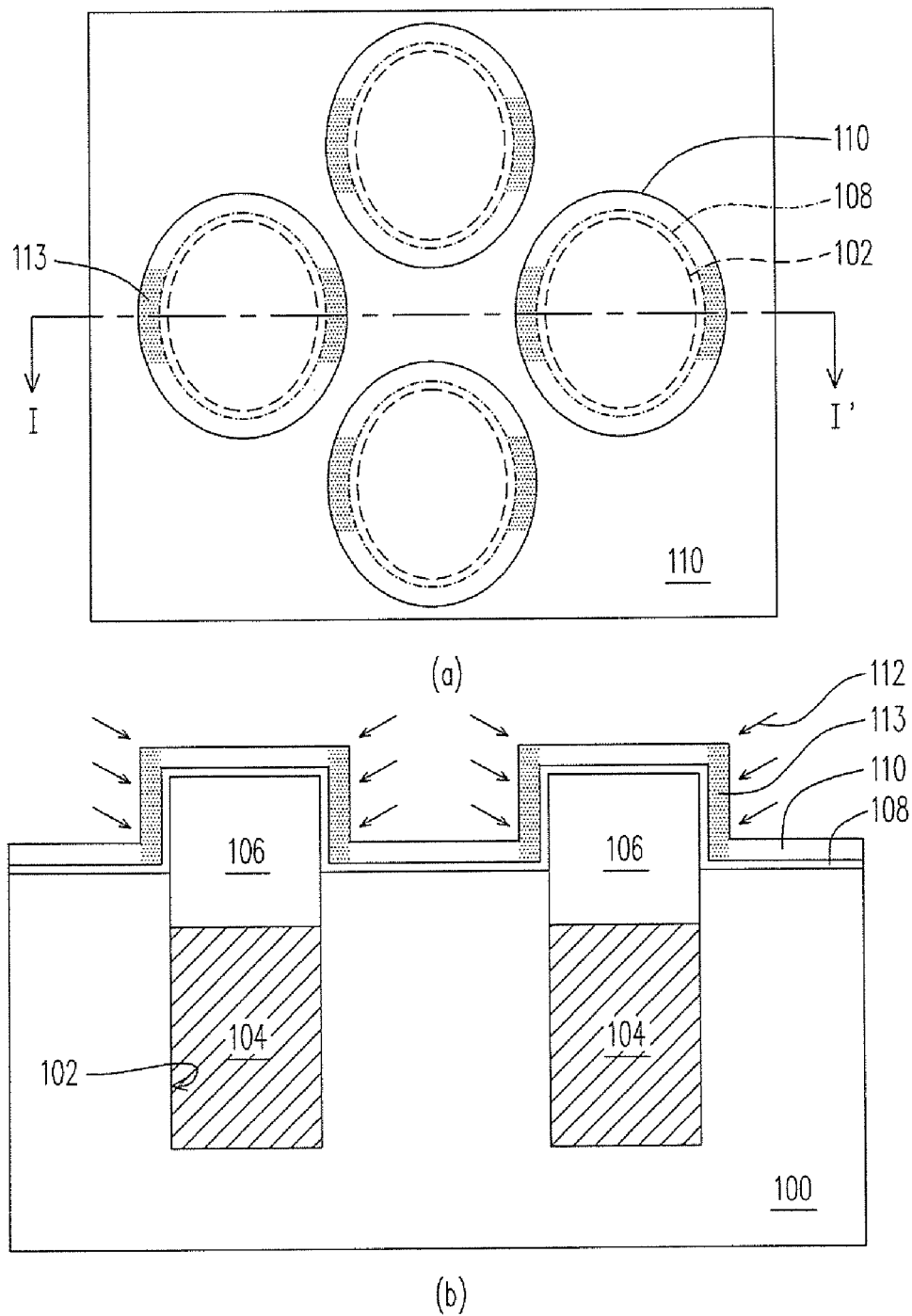
Figure 3:
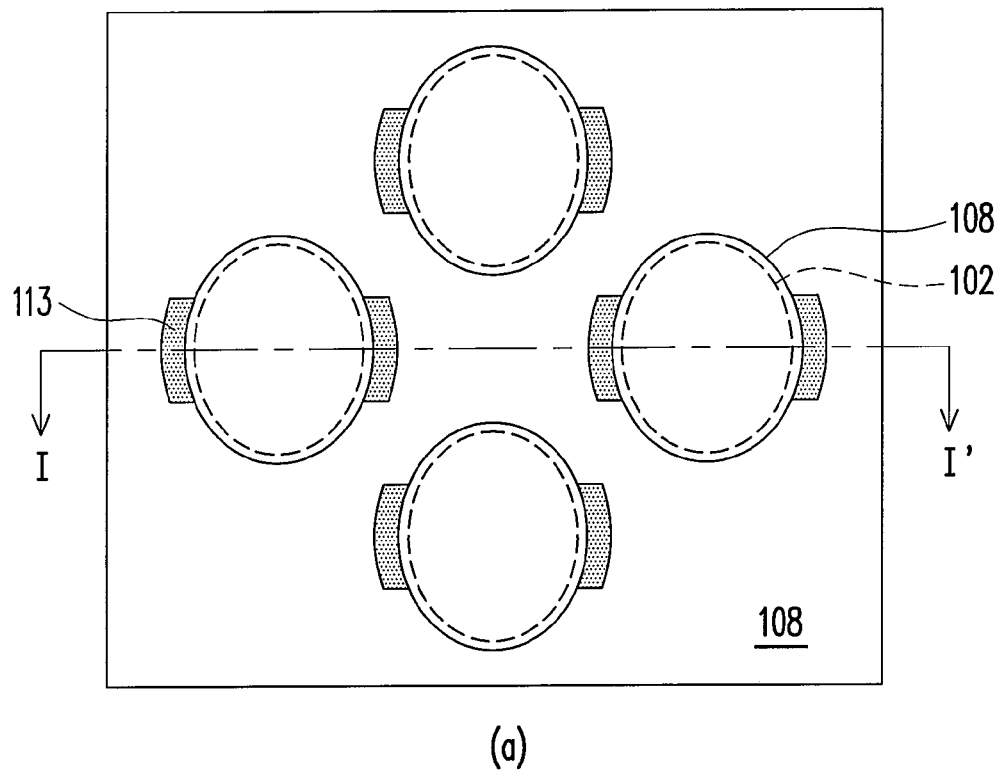
Figure 3:
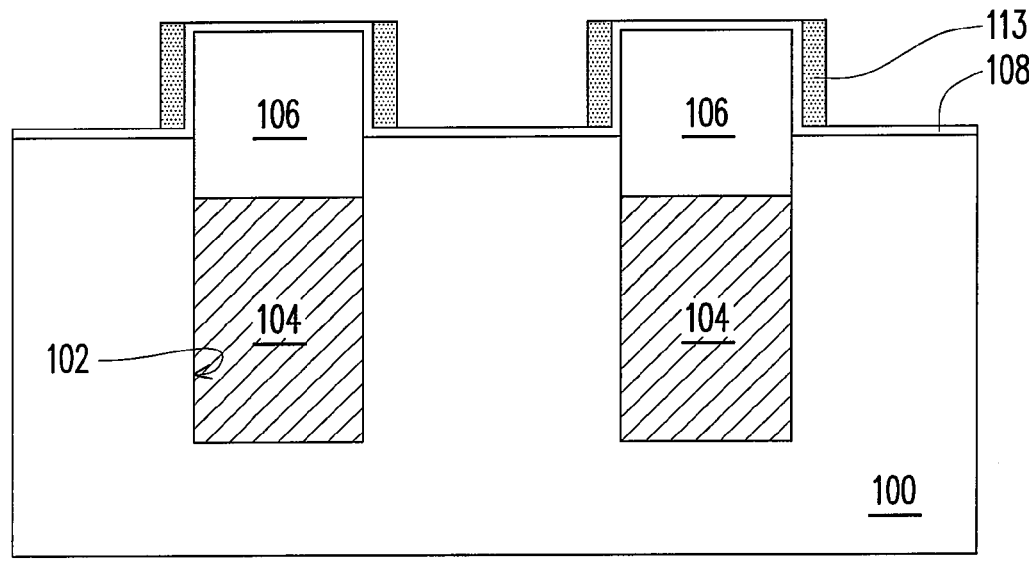
Figure 4:
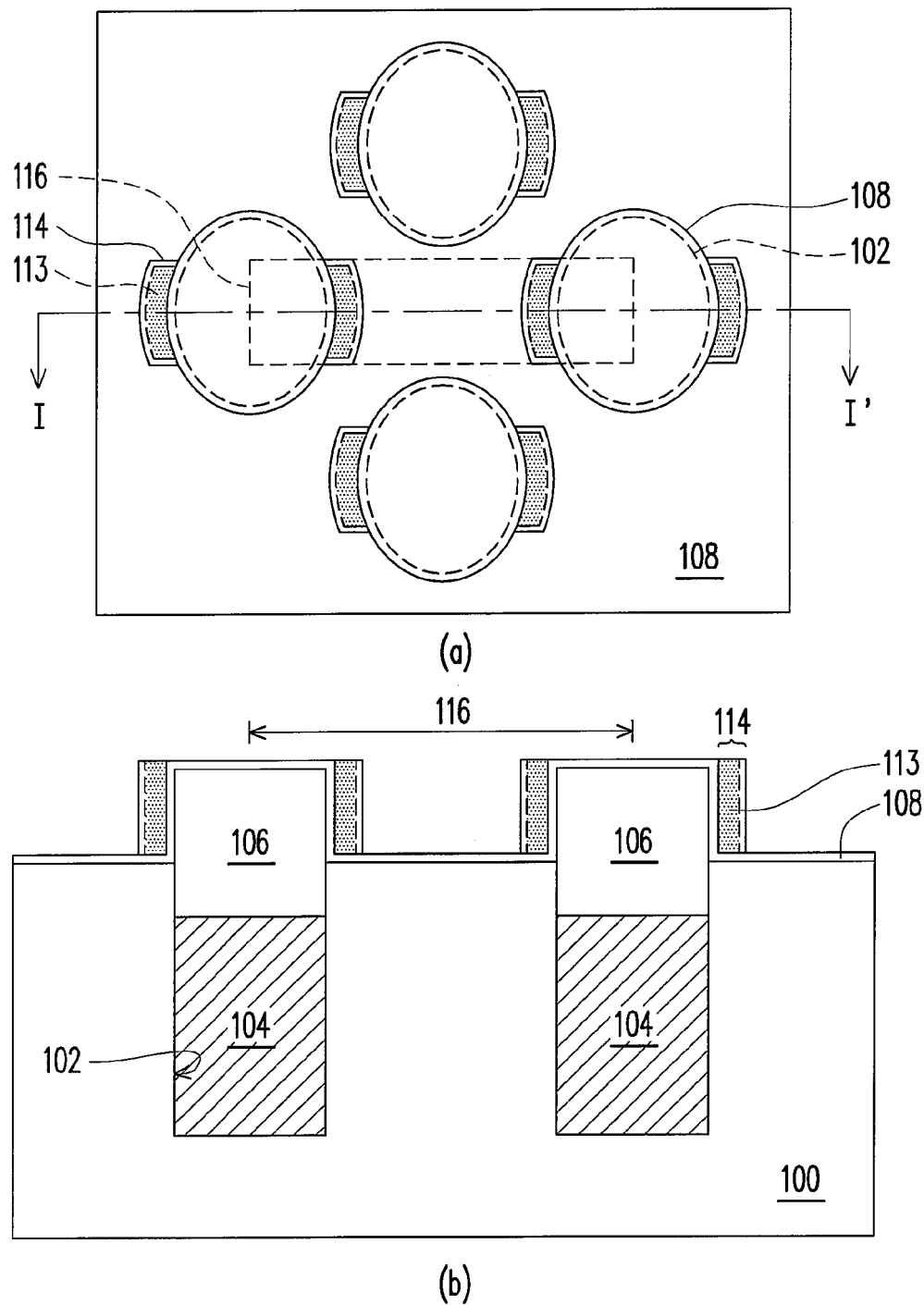
Figure 5:
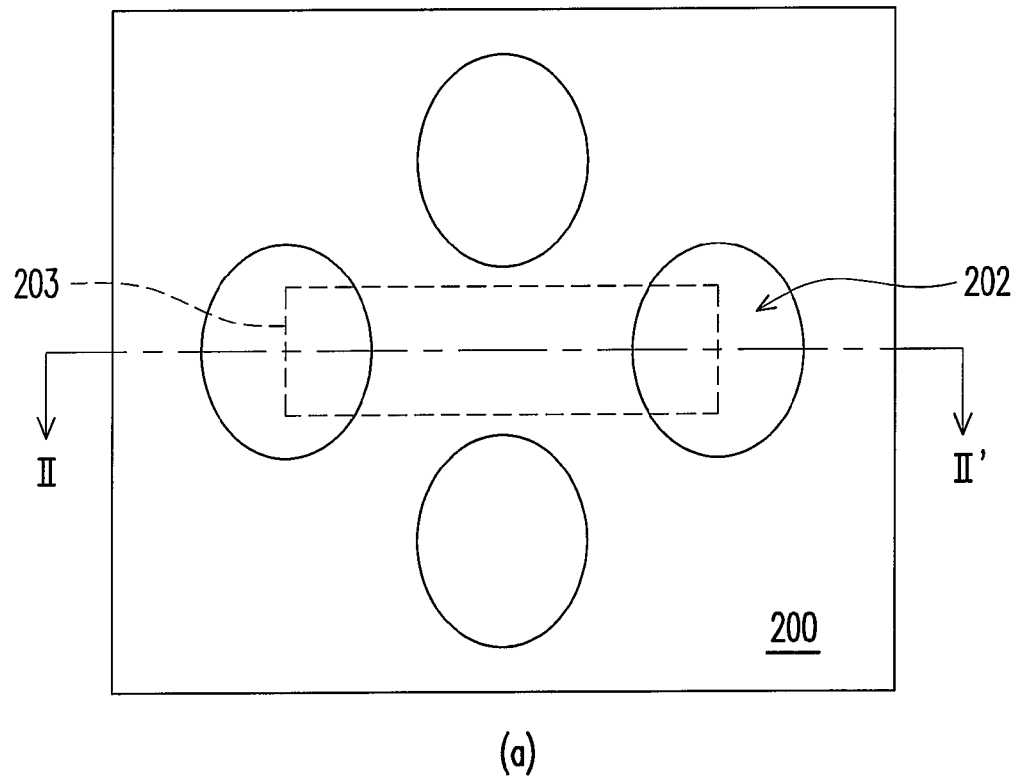
FIG. 5 through FIG. 14 are schematic views illustrating the steps for fabricating a dynamic random access memory (DRAM) according to the embodiment of the present invention. Herein, the sub-diagrams (a) of FIG. 5 through FIG. 14 illustrate schematic top views and sub-diagrams (b) of FIG. 5 through FIG. 14 illustrate schematic cross-sectional views along line II-II' of FIG. 5($a$) through FIG. 14($a$).
Figure 5:
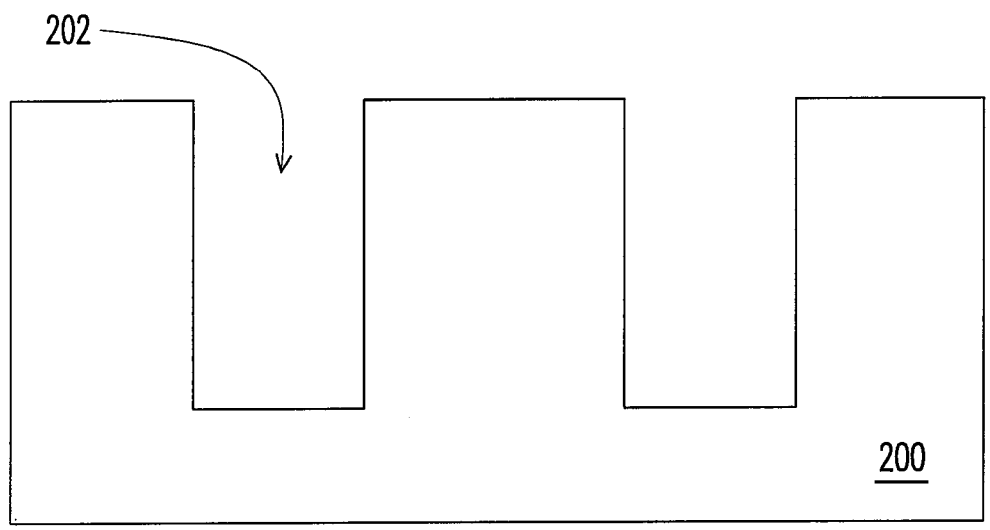

First, please refer to FIG. 5, a plurality of trenches 202 are formed in a substrate 200. The area between any two adjacent trenches 202 in the same column is pre-designated to be an active area 203. The shape for the opening of the trench 202 appears to be rectangular and the corners of the opening can be rounded to make the opening to appear to be more oval.

The trenches 202 are formed, for example, by forming a mask layer (not shown) sequentially on the substrate 200. The mask layer includes, for example, a pad oxide layer and a silicon nitride layer. The pad oxide layer is formed by, for example, a thermal oxidation process. The silicon nitride layer is formed by, for example, a chemical vapor deposition process. Thereafter, the mask layer is patterned and the substrate 200 is etched to form trenches 202 in the substrate 200.

Figure 6:
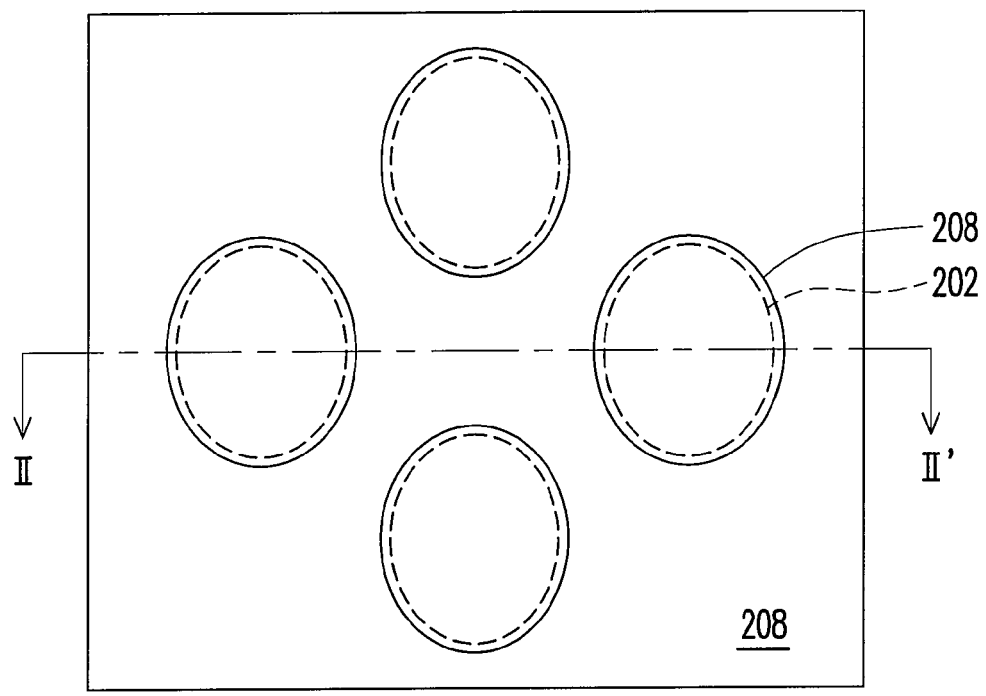
Figure 6:
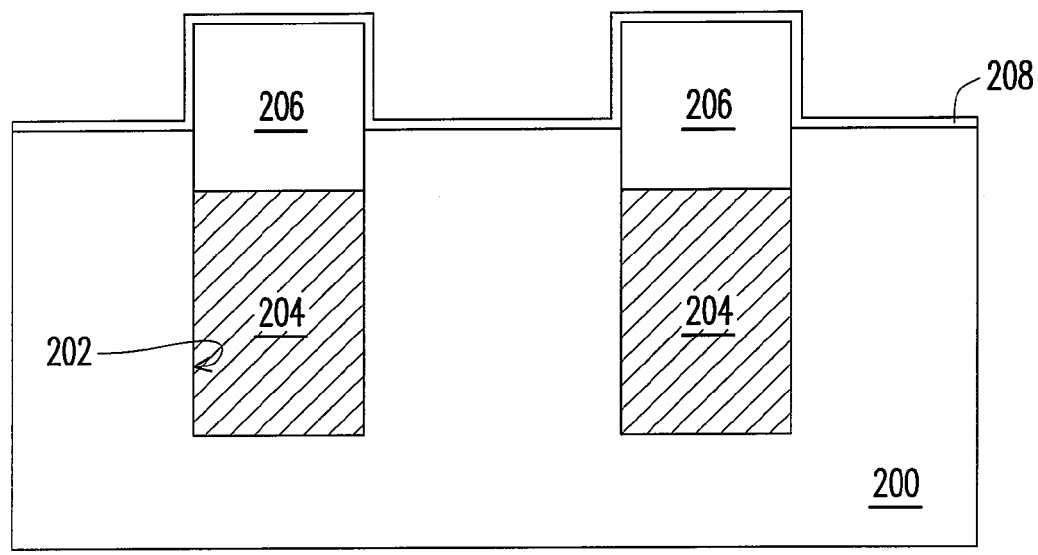

Next, please refer to FIG. 6. A trench capacitor 204 is formed in each trench 202. The trench capacitor 204 is formed, for example, by forming a doped region (not shown) on the bottom of the trench 202 in the substrate 200, which serves as an electrode of the capacitor. Thereafter, a dielectric layer (not shown) is formed on the surface of the trench 202, which serves as a capacitor dielectric layer. Afterward, a conductive layer is formed on the dielectric layer, which serves as another electrode of the capacitor. Certainly, the present embodiment is not limited to the method for fabricating the trench capacitor 204 and each component of the trench capacitor 204 described above.

After each of the trench capacitors 204 is formed, a pillar dielectric layer 206 is formed to cover the trench capacitor 204 and acts as an isolation layer. The upper surface of the pillar dielectric layer 206 protrudes from the surface of the substrate 200. The material used for fabricating the dielectric layer 206 is, for example, silicon oxide, and the method used for fabricating the same is, for example, a chemical vapor deposition process. In addition, a silicon nitride layer 208 is formed on the substrate 200 to conformably cover the pillar dielectric layer 206. The silicon nitride layer 208 is formed by, for example, a chemical vapor deposition process.

Figure 7:
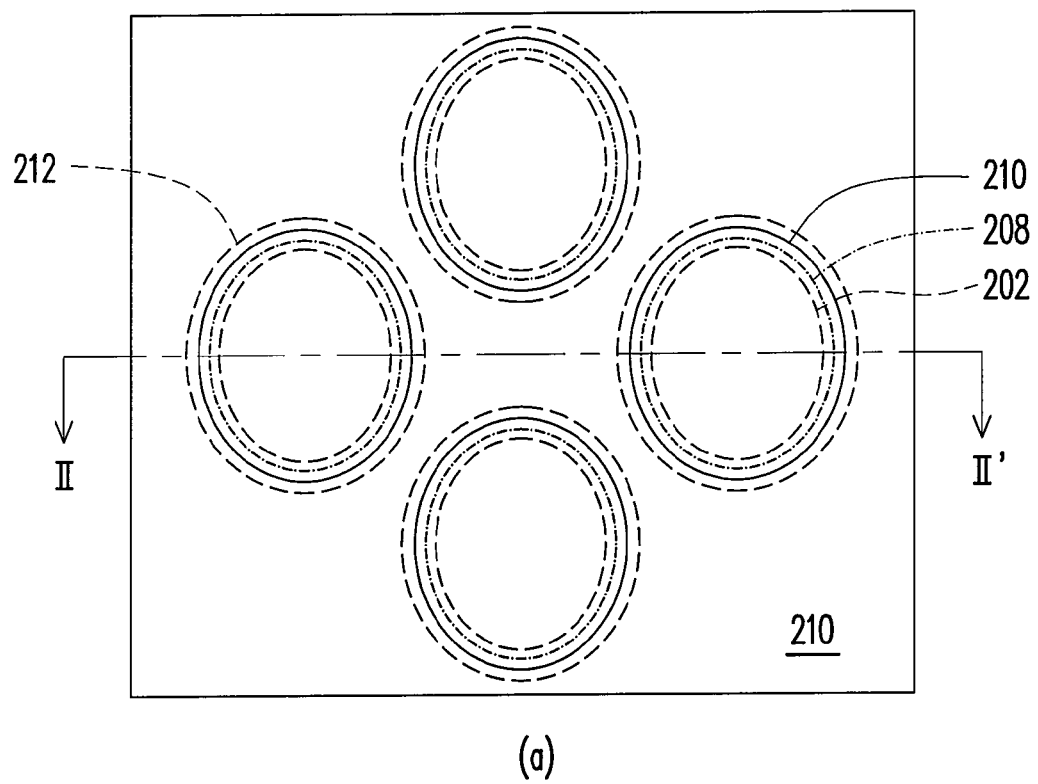
Figure 7:
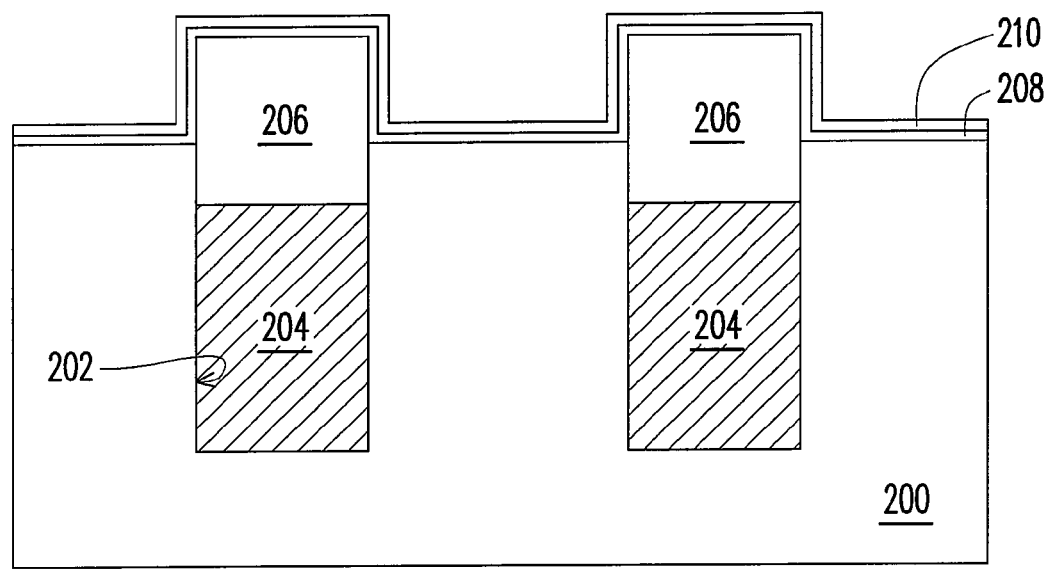

Thereafter, please refer to FIG. 7. A first silicon layer 210 is formed over the substrate 200 to conformably cover the silicon nitride layer 208. The material used for fabricating the first silicon layer 210 is, for example, polysilicon or amorphous silicon. The first silicon layer 210 is formed by, for example, a chemical vapor deposition process or other suitable process. Further, the thickness of the first silicon layer 210 is smaller than that of a design rule for optimization of fabrication. As shown in FIG. 7(a), the region 212 marked by the dotted line represents the size of a design rule for optimization of fabrication.

Figure 8:
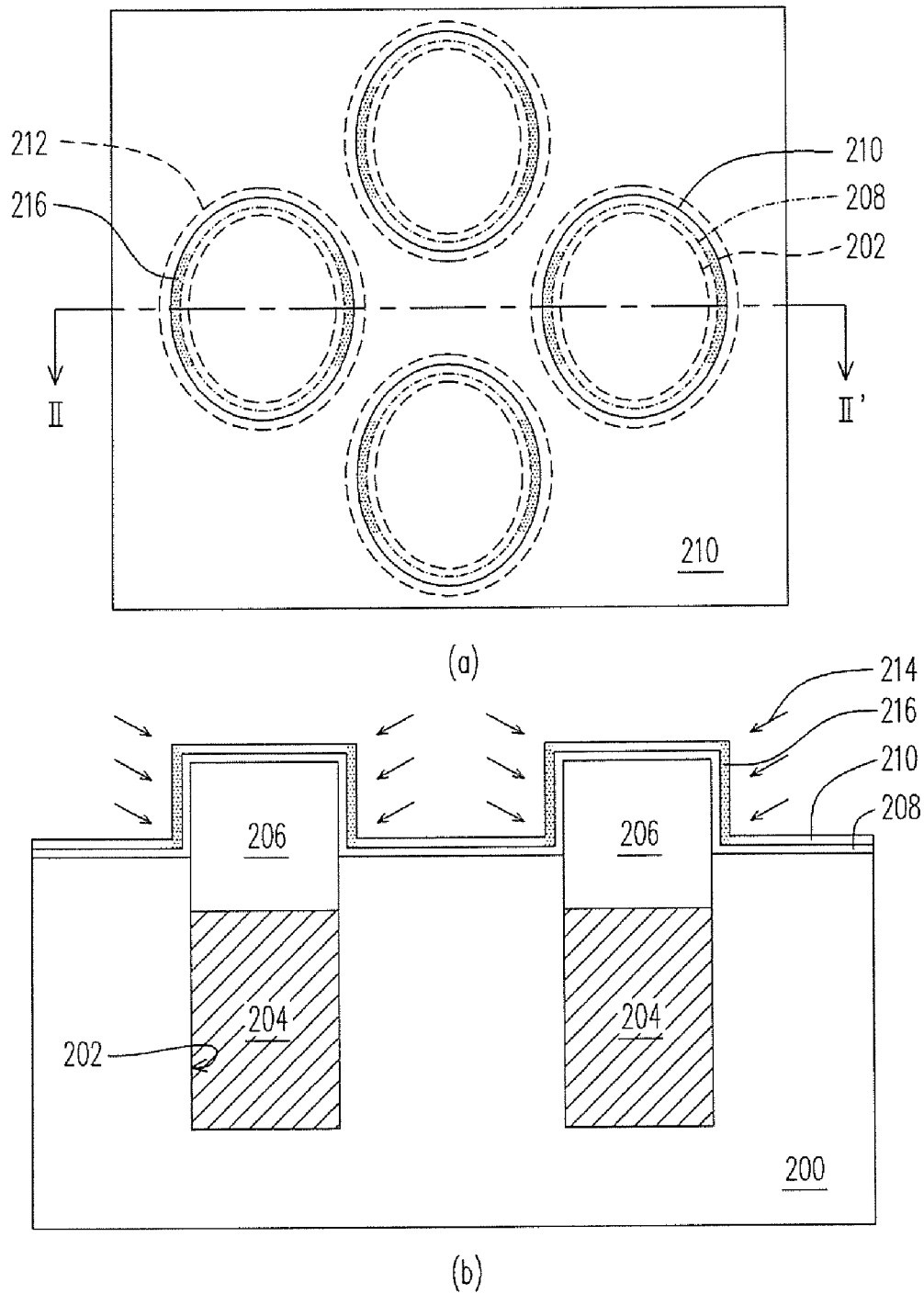

Afterward, please refer to FIG. 8. A first ion implantation process 214 is performed to implant ions into the first silicon layer 210 disposed on top of the pillar dielectric layer 206 and the first silicon layer 210 disposed on the two sidewalls of the pillar dielectric layer 206. Herein, ions are diffused into the first silicon layer 210 disposed on the two sidewalls of the pillar dielectric layer 206 to form a first doped region 216. The first ion implantation process 214 is a tilt angle ion implantation process and the dopants used are, for example, boron ions, arsenic ions or nitrogen ions. In view of the above, the etch rate of the doped first silicon layer 210 is slower than that of the non-doped region of the first silicon layer 210.

Figure 9:
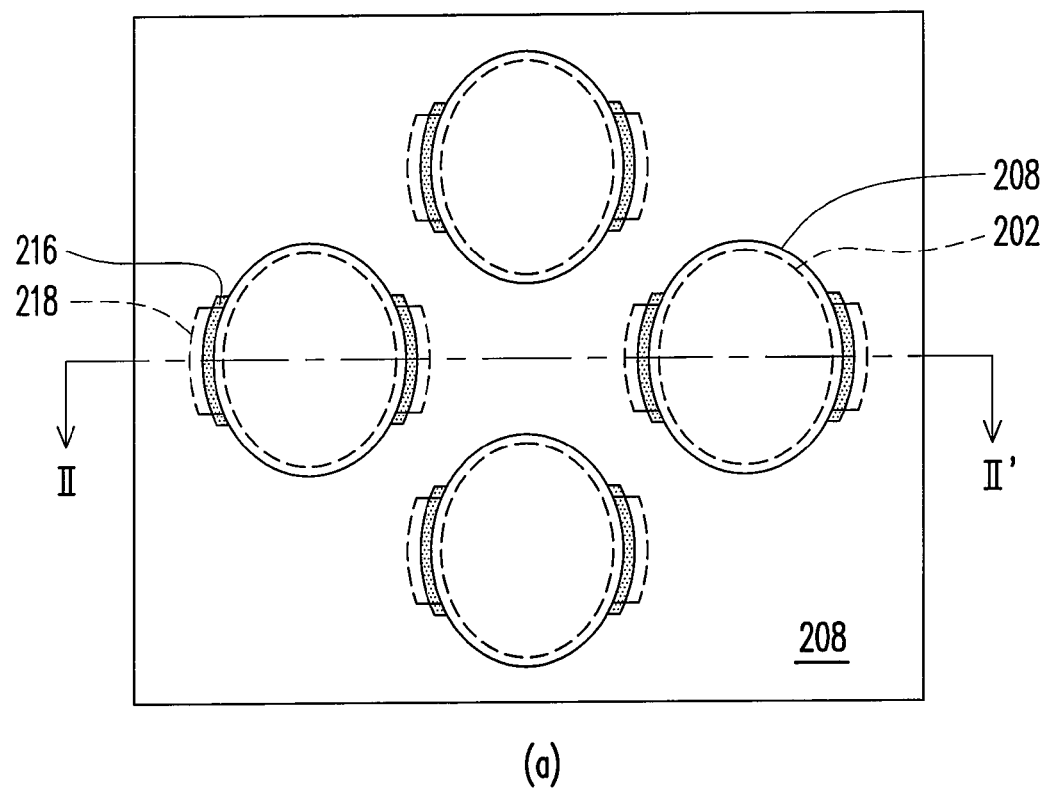
Figure 9:
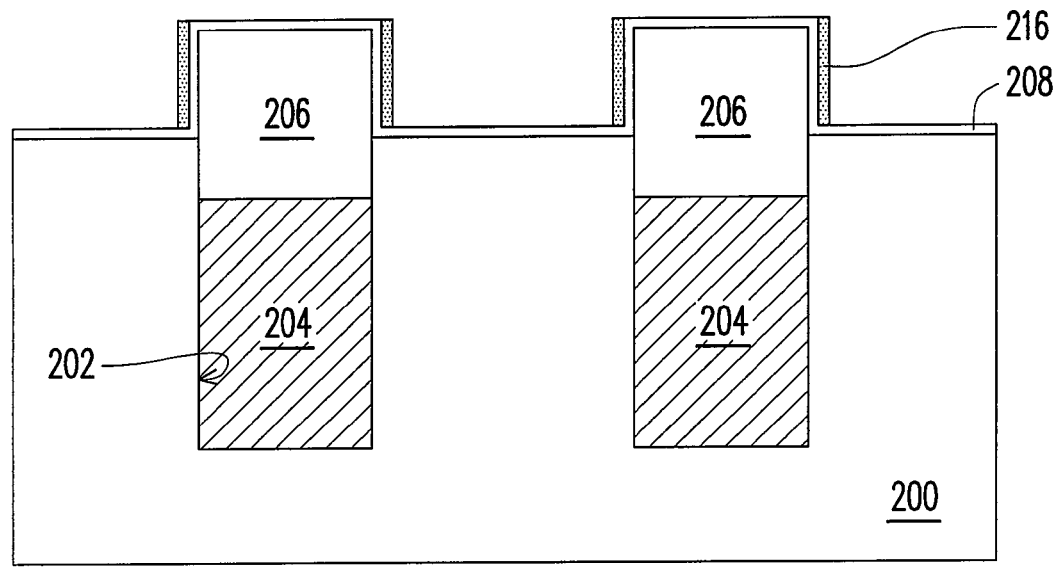

Subsequently, please refer to FIG. 9. A first removing process is performed to remove the first silicon layer 210 disposed on top of the pillar dielectric layer 206 and the first silicon layer 210 of the first non-doped region, but retain the first doped region 216. The first removing process includes, for example, performing an anisotropic etching process to etch a portion of the first silicon layer 210 disposed on the substrate 200 and on top of the pillar dielectric layer 206, but retain the portion of the first silicon layer 210 disposed on the sidewalls of the pillar dielectric layer 206 and the first doped region 216. Next, an isotropic etching process is performed to etch the non-doped region of the first silicon layer 210, but retain the first doped region 216. The etchant used for the above-mentioned isotropic etching process is, for example, ammonia water or potassium hydroxide.

Since the thickness of the first silicon layer 210 is smaller than that of a design rule for optimization of fabrication, the length of the doped region formed in the first silicon layer 210 is longer than that of a design rule for optimization of fabrication when the ion implantation process is performed. More specifically, as shown FIG. 9, the region 218 marked by the dotted line represents the doped region of a design rule for optimization of fabrication and the length of the first doped region 216 is longer than the length of the region 218 of a design rule for optimization of fabrication.

Figure 10:
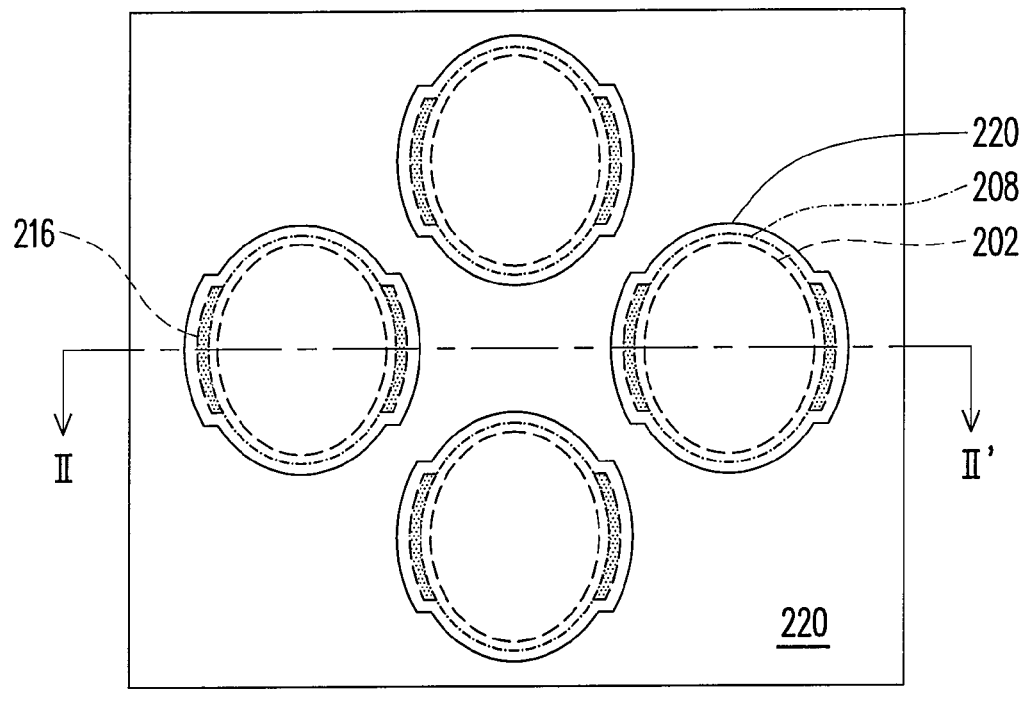
Figure 10:
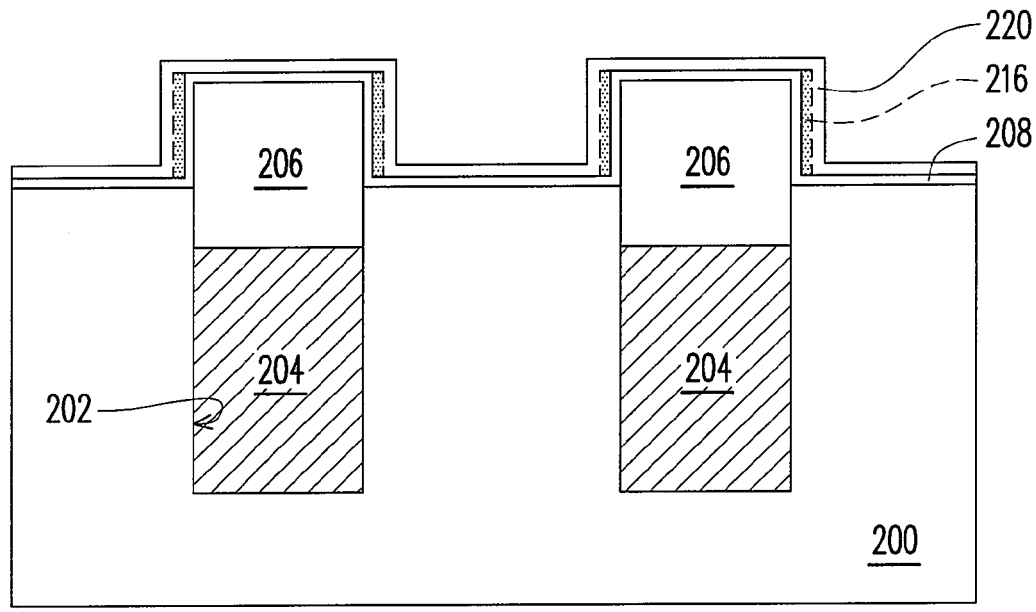

Subsequently, please refer to FIG. 10. A second silicon layer 220 is formed on the substrate 200 to conformably cover the silicon nitride layer 208 and the first doped region 216. The material used for fabricating the second silicon layer 220 is, for example, polysilicon or amorphous silicon. The thickness of the second silicon layer 220 is smaller than that of a design rule for optimization of fabrication. The second silicon layer 220 is formed by, for example, a chemical vapor deposition process.

Figure 11:
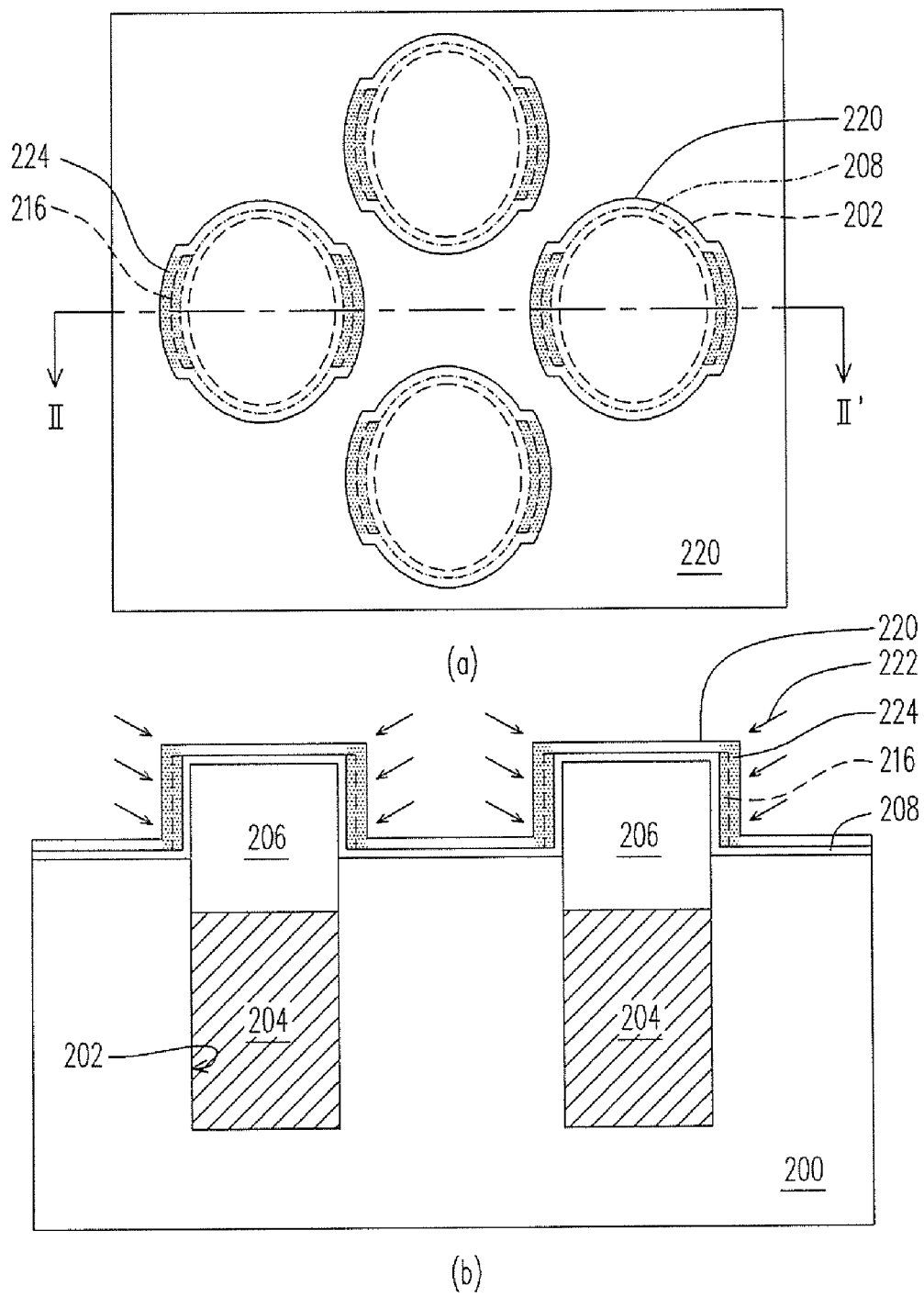

Afterward, please refer to FIG. 11. A second ion implantation process 222 is performed to implant ions into the second silicon layer 220 disposed on top of the pillar dielectric layer 206 and the second silicon layer 220 disposed on the two sidewalls of the pillar dielectric layer 206. Herein, ions are diffused into the second silicon layer 220 disposed on the two sidewalls of the pillar dielectric layer 206 to form a second doped region 224. In view of the above, the etch rate of the second doped region 224 is slower than that of the second silicon layer that is not covered by the second doped region 224. The second ion implantation process 222 is a tilt angle ion implantation process and the dopants are, for example, boron ions, arsenic ions or nitrogen ions.

Figure 12:
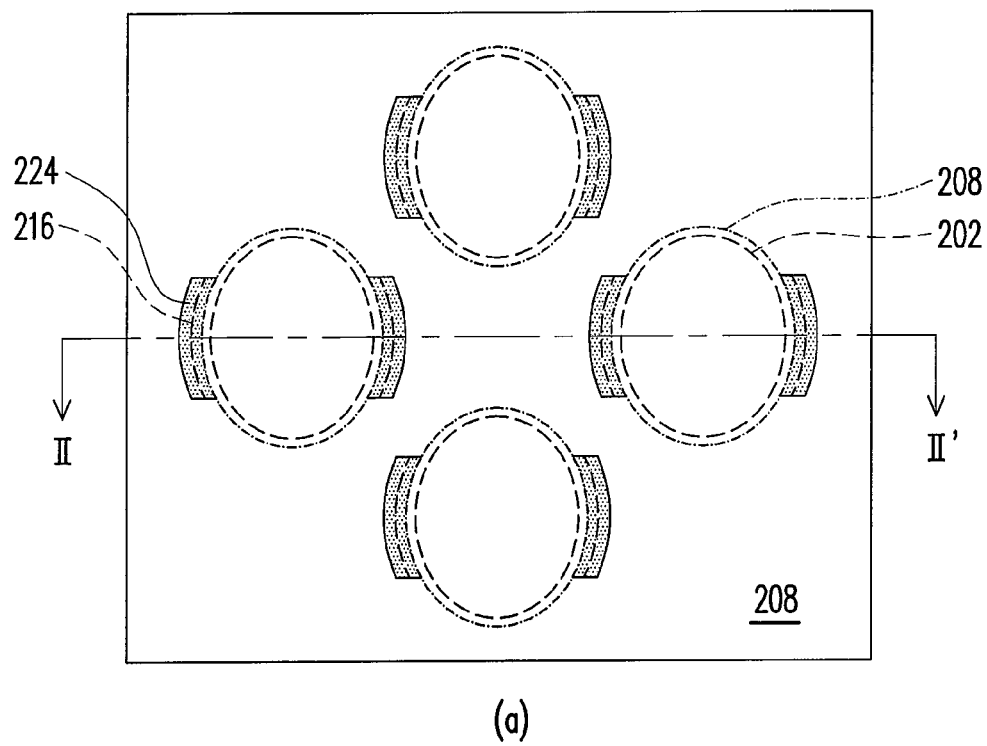
Figure 12:
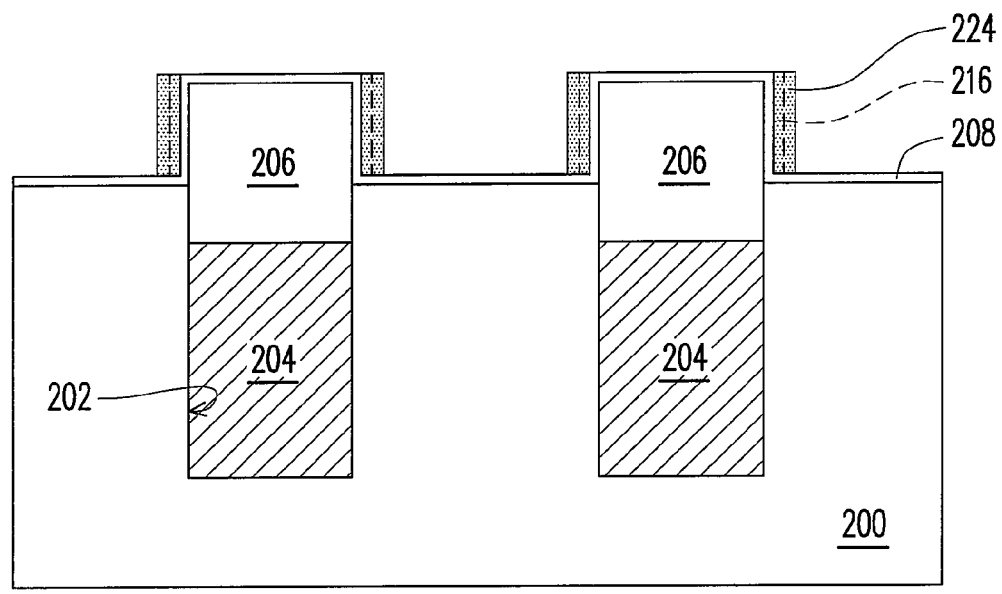

Then, please refer to FIG. 12. A second removing process is performed to remove the second silicon layer 220 disposed on top of the pillar dielectric layer 206 and the second silicon layer 220 of the second non-doped region, but not the second doped region 224. The second removing process includes, for example, performing an anisotropic etching process to etch the second silicon layer 220 disposed on the substrate 200 and on top of the pillar dielectric layer 206, but retain the portion of the second silicon layer 220 disposed on the sidewalls of the pillar dielectric layer 206 and the second doped region 224. Afterward, an isotropic etching process is performed to etch the non-doped region of the second silicon layer 220 but not the second doped region 224. The etchant used for the above-mentioned isotropic etching process is, for example, ammonia water or potassium hydroxide.

Figure 13:
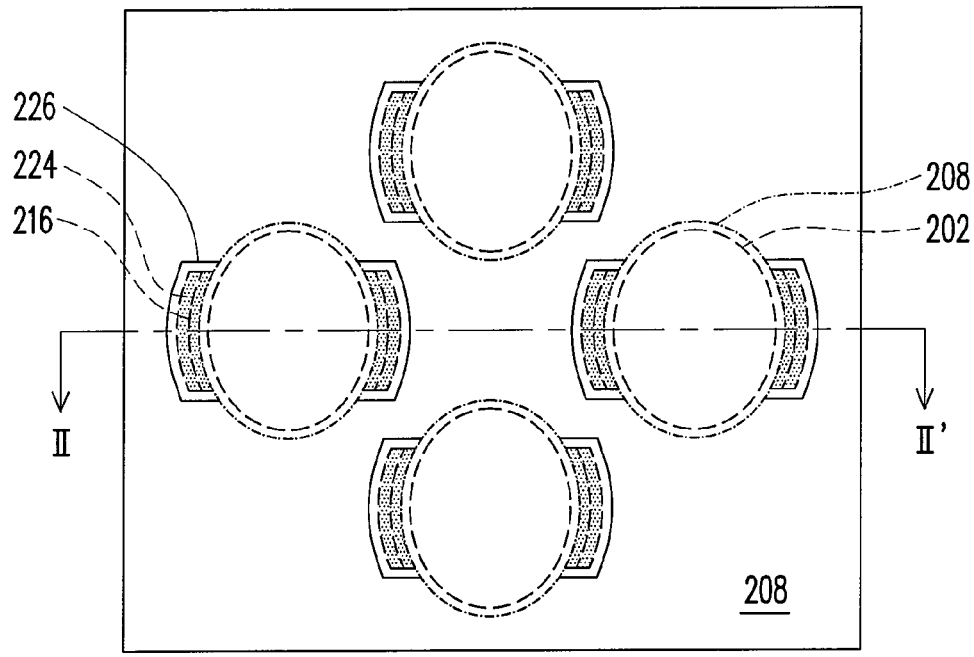
Figure 13:
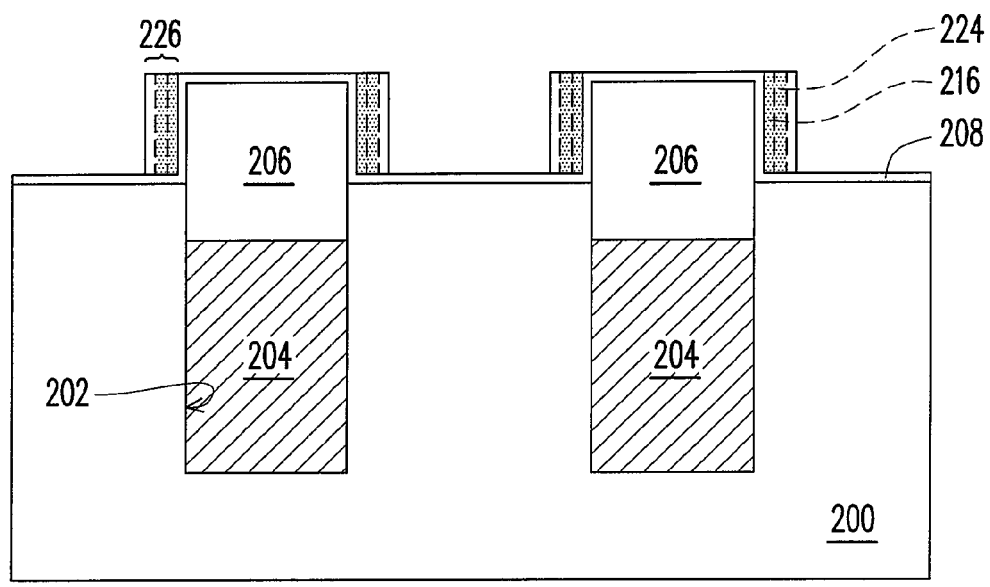

Afterward, please refer to FIG. 13. An oxidation process is performed to the first doped region 216 and the second doped region 224 to form an oxidation spacer 226 containing a silicon layer and an oxide layer on the sidewalls of the pillar dielectric layer 206. In the oxidation process, oxygen, for example, is used to react with the first doped region 216 and the second doped region 224 to form the oxidation spacer 226. The thickness of the oxidation spacer 226 is that of a design rule for optimization of fabrication. Further, the region of the above-mentioned oxidation spacer 226 is the landing area for the bit line contact.

It should be noted that the length of the first doped region 216 is longer than that of a design rule for optimization of fabrication. Therefore, the length of the oxidation spacer 226 is longer than that of a design rule for optimization of fabrication. In other words, the region of the oxidation spacer 226 is larger than the landing area of a conventional bit line contact. Therefore, a larger process window is formed when defining the bit line contact opening, preventing overlay errors and misalignment problems that lead to a short between the bit line contact and the transistor.

After the oxidation spacer 226 is formed, the subsequent fabrication including defining an active area and manufacturing a transistor can be proceeded.

Figure 14:
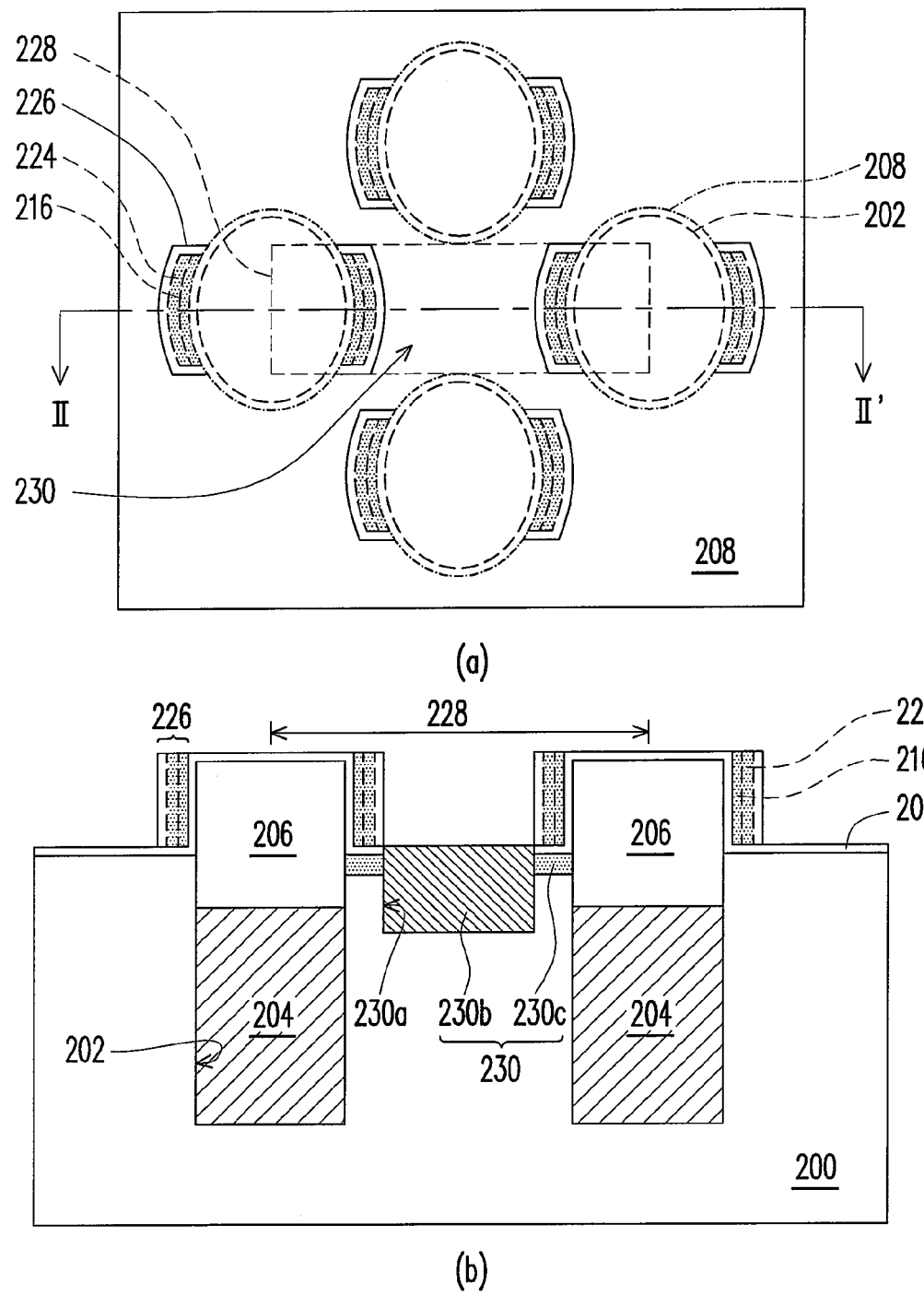

Consequently, please refer to FIG. 14. An active area 228 is defined between two adjacent trenches 202. The active area 228 is fabricated by, for example, forming a mask layer (not shown) used to define the active area 228 on the substrate 200. The mask layer is, for example, a photoresist layer that covers the region pre-designated for the active area 228. Thereafter, the mask layer is used as an etching mask. Therefore, the region that is not covered by the mask layer is etched to form shallow trenches (not shown) in the substrate 200. Afterward, an insulation layer (not shown) is formed in the shallow trenches which serve as an isolation structure. The material used for fabricating the insulation layer is, for example, silicon oxide and the method used for fabricating the same is, for example, a high density plasma chemical vapor deposition process (HDP CVD). After the isolation structure is formed, a plurality of active areas 228 are defined in the substrate 200.

After the active areas 228 are formed, a transistor 230 is formed in the active areas 228 that are not covered by the oxidation spacer 226. The transistor 230 is, for example, a recess channel type transistor or a stacked type transistor. In the present embodiment, a recess channel type transistor is used as an example for illustration. The transistor 230 is formed by, for example, using the oxide spacer 226 as an etching mask to etch the substrate 200 and form a trench 230a in the substrate 200, followed by fabricating a gate oxide layer and a gate in the trench 230a sequentially to form a gate structure 230b, and finally fabricating a source/drain region 230c below the oxidation spacer 226 in the substrate 200.

Certainly, after the transistor 230 is fabricated, the oxidation spacer 226 can be removed and the region of the oxidation spacer 226 can be used as the landing area for the bit line contact for subsequent fabrication process of the bit line contact and that of other interconnects. The aforementioned fabrication process is well known to those skilled in the art. Therefore, a detailed description thereof is omitted.

Further, it should be noted that, in the above-mentioned embodiment, the steps of forming the silicon layer, and performing the ion implantation process and the removing process are performed twice and the oxidation process is performed once to satisfy the design rule for optimization of fabrication. As a result, in the present embodiment, the thickness of the first silicon layer 210 is approximately half of that of a design rule for optimization of fabrication and the thickness of the second silicon layer 220 is approximately half of that of a design rule for optimization of fabrication. Certainly, in other embodiments, the steps of forming the silicon layer, and performing the ion implantation process and the removing process can be performed more than twice and the oxidation process is performed once to satisfy the design rule for optimization of fabrication. If the steps of forming the silicon layer, and performing the ion implantation process and the removing process are performed three times, the thickness of the silicon layer fabricated in each time can be approximately one third of that of a design rule for optimization of fabrication. Nevertheless, there is a tradeoff between the number of times the steps of forming the silicon layer, and performing the ion implantation process and the removing process are repeated and the manufacturing costs thereof. Hence, the number of times the steps of forming the silicon layer, and performing the ion implantation process and the removing process are repeated can be adjusted accordingly.

In view of the above, the fabrication process of the present invention forms a longer oxidation spacer without altering the thickness thereof in accordance to the design rule for optimization of fabrication, which is used as the landing area for the bit line contact. Thus, a larger process window can be fabricated when defining the bit line contact opening to improve the precision of fabrication.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A process for fabricating a dynamic random access memory, comprising:
    forming a plurality of trenches in a substrate, wherein a trench capacitor is formed in each trench, a pillar dielectric layer is formed on the trench capacitor, and the upper surface of the pillar dielectric layer protrudes from the surface of the substrate;
    forming a silicon nitride layer and a first silicon layer sequentially on the substrate to conformably cover the pillar dielectric layer, wherein the thickness of the first silicon layer is smaller than that of a design rule for optimization of fabrication;
    performing a first ion implantation process to implant ions into the first silicon layer disposed on top of the pillar dielectric layer and on the two sidewalls of the pillar dielectric layer, wherein ions are diffused into the first silicon layer disposed on the two sidewalls of the pillar dielectric layer to form a first doped region;
    performing a first removing process to remove the first silicon layer disposed on top of the pillar dielectric layer and the first silicon layer on the two sidewalls of the pillar dielectric layer, but retain the first doped region;
    forming a second silicon layer on the substrate to conformably cover the silicon nitride layer and the first doped region, wherein the thickness of the second silicon layer is smaller than that of a design rule for optimization of fabrication;
    performing a second ion implantation process to implant ions into the second silicon layer disposed on top of the pillar dielectric layer and on the two sidewalls of the pillar dielectric layer, wherein ions are diffused into the second silicon layer disposed on the two sidewalls of the pillar dielectric layer to form a second doped region;
    performing a second removing process to remove the second silicon layer disposed on top of the pillar dielectric layer and the second silicon layer on the two sidewalls of the pillar dielectric layer, but retain the second doped region; and
    performing an oxidation process to the first doped region and the second doped region to form an oxidation spacer on the sidewalls of the pillar dielectric layer.

2. The process of claim 1, wherein the etch rate of the first doped region is slower than that of the first silicon layer except the first doped region.

3. The process of claim 1, wherein the etch rate of the second doped region is slower than that of the second silicon layer except the second doped region.

4. The process of claim 1, wherein the thickness of the oxidation spacer is the thickness of a design rule for optimization of fabrication.

5. The process of claim 1, wherein, after the oxidation spacer is formed, the process further comprises:
    defining an active area between two adjacent trenches; and
    forming a gate structure in the active area that is not covered by the oxidation spacer.

6. The process of claim 1, wherein the first ion implantation process is a tilt angle ion implantation process.

7. The process of claim 1, wherein the second ion implantation process is a tilt angle ion implantation process.

8. The process of claim 1, wherein the material used for fabricating the pillar dielectric layer comprises silicon oxide.

9. The process of claim 1, wherein the material used for fabricating the first silicon layer and the second silicon layer comprises polysilicon or amorphous silicon.

10. The process of claim 1, wherein the first removing process further comprises:
    performing an anisotropic etching process to etch the first silicon layer disposed on the substrate and on top of the pillar dielectric layer, but retain a portion of the first silicon layer and the first doped region disposed on the sidewalls of the pillar dielectric layer; and
    performing an isotropic etching process to etch the first silicon layer disposed on the sidewalls of the pillar dielectric layer, but retain the first doped region.

11. The process of claim 10, wherein the etchant used for the isotropic etching process comprises ammonia water or potassium hydroxide.

12. The process of claim 1, wherein the second removing process comprises:
    performing an anisotropic etching process to etch the second silicon layer disposed on the substrate and on top of the pillar dielectric layer, but retain a portion of the second silicon layer and the second doped region disposed on the sidewalls of the pillar dielectric layer; and
    performing an isotropic etching process to etch the second silicon layer disposed on the sidewalls of the pillar dielectric layer, but retain the second doped region.

13. The process of claim 12, wherein the etchant used for the isotropic etching process comprises ammonia water or potassium hydroxide.

* * * * *